United States Patent [19]
Okazawa

[11] Patent Number: 5,787,036
[45] Date of Patent: Jul. 28, 1998

[54] FLASH MEMORY INCLUDING IMPROVED TRANSISTOR CELLS AND A METHOD OF PROGRAMMING THE MEMORY

[75] Inventor: Takeshi Okazawa, Tokyo, Japan

[73] Assignee: NEC Corporation, Tokyo, Japan

[21] Appl. No.: 764,362

[22] Filed: Dec. 12, 1996

[30] Foreign Application Priority Data

Dec. 12, 1995 [JP] Japan ................... 7-322889

[51] Int. Cl.[6] ........................................... G11C 16/02
[52] U.S. Cl. .......................... 365/185.18; 365/185.01; 365/185.24
[58] Field of Search ................. 365/185.18, 185.01, 365/185.24; 257/315, 316, 317

[56] References Cited

U.S. PATENT DOCUMENTS

| | | | |
|---|---|---|---|
| 5,416,738 | 5/1995 | Shrivastava | 365/185.18 |
| 5,491,657 | 2/1996 | Haddad et al. | 365/185.18 |
| 5,511,021 | 4/1996 | Bergemont et al. | 365/185.18 |
| 5,526,315 | 6/1996 | Kaya et al. | 365/185.18 |

*Primary Examiner*—Son T. Dinh
*Attorney, Agent, or Firm*—Helfgott & Karas, P C.

[57] ABSTRACT

A flash memory includes a plurality of MOSFETs. Each of the MOSFETs comprises a first conductive type substrate, a source, and a drain. The source and the drain are formed on one major surface of the substrate. A floating gate is situated over the major surface via a first insulation layer in a manner to control a current flowing through a channel between the source and the drain. The floating gate is highly resistive so as to essentially hold electrons in the region into which they were are injected from a depletion layer formed in the channel. A control gate is further provided over the floating gate via a second insulation layer.

11 Claims, 7 Drawing Sheets

FLOATING GATE : CONDUCTIVE

REPROGRAMMING

| LEVEL 1 | LEVEL 2 | LEVEL 3 | LEVEL 4 |
|---|---|---|---|
| NO PROSCEDURE | $V_s = 0V$<br>$V_d = +7V$<br>$V_g = +9V$<br>$V_{sub} = 0V$ | $V_s = 0V$<br>$V_d = +7V$<br>$V_g = +11V$<br>$V_{sub} = 0V$ | $V_s = 0V$<br>$V_d = +7V$<br>$V_g = +13V$<br>$V_{sub} = 0V$ |

FLOATING GATE : HIGHLY RESISTIVE

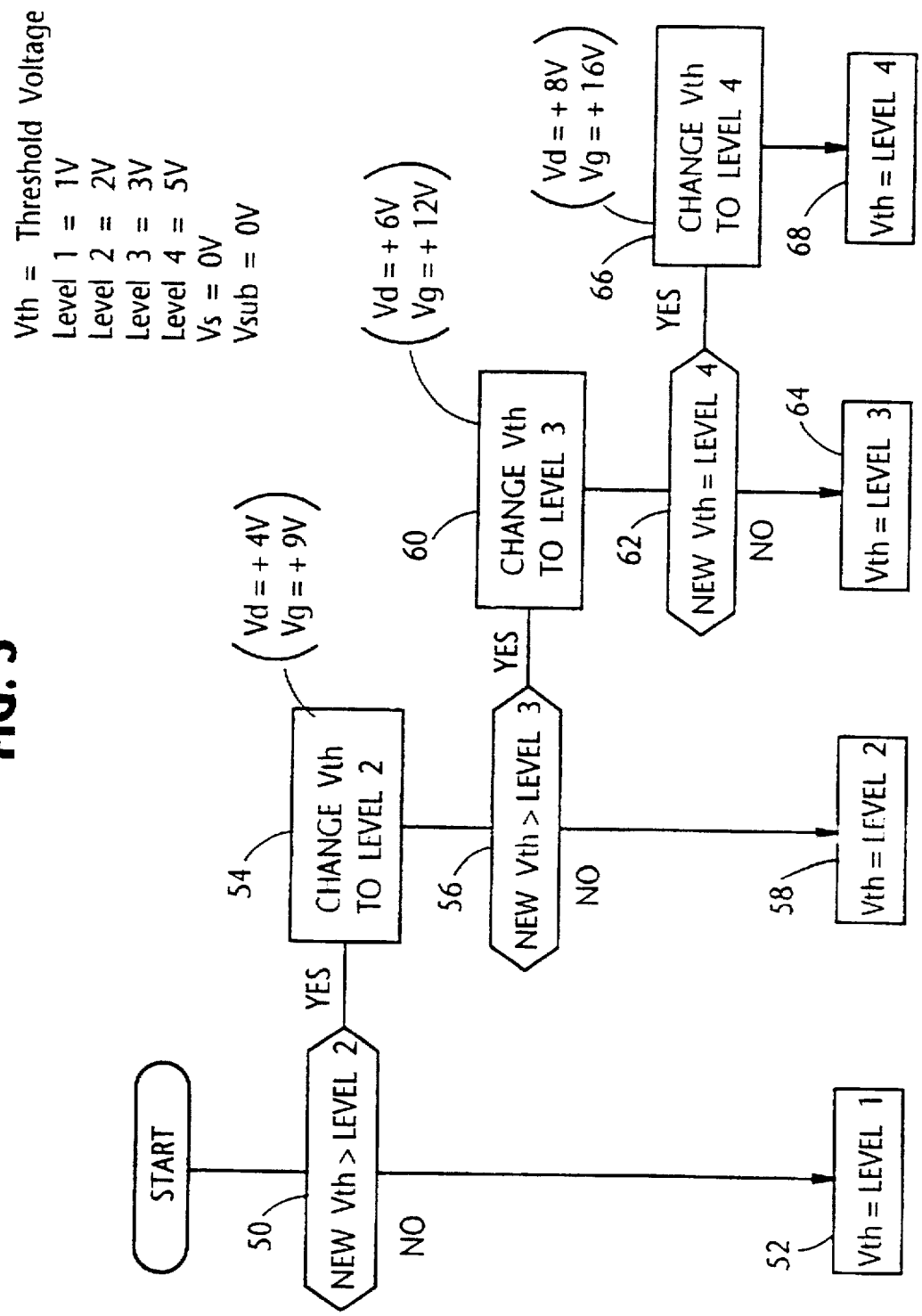

FLASH MEMORY INCLUDING IMPROVED TRANSISTOR CELLS AND A METHOD OF PROGRAMMING THE MEMORY

BACKGROUND OF THE INVENTION

1. Field of the Invention

The present invention relates to a flash EEPROM (electrically erasable programmable read-only memory) including improved transistor cells and a method of programming (or reprogramming) a flash EEPROM including the improved transistor cells.

2. Description of the Related Art

A flash EEPROM (hereinlater simply referred to as a flash memory) is a new variation of a programmable read-only memory. The flash memories are gaining favor because they can be erased and programmed (or reprogrammed) faster than the existing EPROMs and because they use a simpler storage cell, thereby allowing more memory cells on a single chip. Further, in order to improve cost performance per transistor cell, it has been proposed for one cell to store more than two pieces of information (viz., more than two bits) as mentioned in detail later.

As is well known in the art, a flash memory is provided with a matrix array of transistor cells, each having a structure of the nature shown in FIG. 1, and which are arranged in rows and columns (as best illustrated in FIG. 4).

Prior to turning to the present invention it is deemed preferable to describe, with reference to FIGS. 1, 2A and 2B, a conventional flash memory cell and a programming or reprogramming method.

In FIG. 1, a single transistor cell (depicted by numeral 10) is schematically shown in cross-section. The transistor cell 10 comprises a p-type silicon substrate 12 which carries, on the upper portion thereof, two $n^+$ regions: one of which functions as a source 14 and the other of which acts as a drain 16. An n-channel is thus formed between the source 14 and the drain 16. A poly-silicon (polycrystallite silicon) floating gate 18 is provided over the n-channel via a silicon-dioxide insulation layer 20 (about 10 nm in thickness). A control gate 22 is situated over the floating gate 18 via another slilicon-dioxide insulation layer 24 (about 25 nm).

The floating gate 18 is formed to be conductive so as to instantly diffuse electrons injected thereinto. To realize such electrical conductiveness, the floating gate 18 is doped with an impurity such as phosphorus in the order of $10^{20}/cm^3$.

Notations Vs, Vd, Vg and Vsub respectively depict voltage terminals which are coupled, via appropriate metal contacts (not shown), to the source 14, the drain 16, the gate 22 and the silicon substrate 12. It is to be noted that throughout the instant disclosure, the notations Vs, Vd, Vg and Vsub are also respectively indicative of voltages applied to the associated portions for the sake of simplifying the disclosure.

With a transistor cell storing only two values (viz., one bit), the threshold voltage of the cell is defined as the voltage on the floating gate which is required to turn the transistor on. However, with a multi-level (viz., more than two bits) type transistor cell, the floating gate is selectively charged to one among a plurality of threshold voltages while programming or reprogramming. That is to say, the highest threshold voltage determines the potential for turning the transistor on, while the other lower threshold voltages, depending on the respective values, determine the amount of current which flows through the channel between the source and the drain, whereby the cell is capable of storing more than one bit.

Reference is made to FIGS. 2A and 2B, which are diagrams describing erase and reprogramming operations of the conventional transistor cell shown in FIG. 1. It is assumed that before the erase operation, the floating gate 18 (FIG. 1) has one of four threshold levels 1, 2, 3 and 4 which respectively correspond to 1 V, 2 V, 3 V and 5 V (for example). Therefore, it is necessary to erase the injected charges before reprogramming.

During the erase operation, a positive voltage 12 V is applied as the source voltage Vs to the drain 16, the control gate 22, and the substrate 12 grounded (i.e., Vd=Vg=Vsub= 0) as indicated in FIG. 2A. In this case, a high electric field strength of more than 10 MV/cm is developed in the insulation layer 20 and thus, the electrons already injected into the floating gate 18 are impelled into the source 14 due to Fowler-Nordheim tunneling. After a predetermined time period (about one second), the voltage of the floating gate 18 is brought to Level 1 (1 V ) irrespective of the previous threshold level. Thus, the floating voltage of this flash memory cell is set to the first threshold voltage (Level 1 (1 v)).

If there is no need to change the first threshold voltage (Level 1) of the floating gate 18, the reprogramming operation is not required (FIG. 21).

If the threshold voltage of the floating gate 18 should be set to Level 2 (2 V), a positive voltage 9 V is applied to the control gate 22 with Vd=+7 V and Vs=Vsub=0 V. Since the floating gate 18 is isolated from the external voltages (Vg, Vs, etc.), the voltage of the floating gate 18 is uniquely determined by the capacitances between the substrate 12 and the gate 18, between the gates 18 and 22, and by the voltages Vs, Vd, Vg and Vsub. With this voltage setting, the channel electrons acquire energy from the lateral field (from source to drain) and, can be emitted, over the Si—$SiO_2$ barrier between the substrate 12 and the insulation layer 20, to the floating gate 18. That is, hot electrons are injected to the floating gate 18.

In order to change the threshold voltage of the floating gate 18 to Level 3 (3 v), the control gate 22 is supplied with a higher positive voltage 11 V (Vg) with the other voltages unchanged (Vd=+7 V and Vs=Vsub=0 V). On the other hand, if the threshold voltage of the floating gate 18 is set to Level 4 (5 v), the voltage Vg is increased up to voltage 13 V and is applied to the control gate 22 with the other voltages unchanged (Vd=+7 V and Vs=Vsub=0 V).

As discussed above, the drain voltage Vd is kept constant during the entire operation of reprogramming, and thus the depletion width, formed at the edge of the drain 14 and extending toward the source 12, remains unchanged. In this case, the hot electrons are generated in the same region from which they are injected into the floating gate 18. Since the floating gate 18 is conductive, the hot electrons, injected into the floating gate 187 are uniformly diffused thereinto.

In other words, each threshold voltage is solely determined by the amount of hot electrons injected into the floating gate 18. Therefore, in order to precisely determine each threshold value, it is needed to correctly control the amount of injected hot electrons. The requirement for precision is increased as the number of threshold voltages increases and the difference between the thresholds narrows. However, in actual practice it is extremely difficult to precisely control the amount of the injected electrons in each of the very large number of floating gates in a flash memory.

More specifically, it is not easy to fabricate a flash memory in a manner wherein the insulation layers 20 are exactly equal in thickness with each other. Likewise, it is often the case that the flash memory includes transistor cells which are improperly fabricated in a manner wherein the length of channel formed between the source and the drain is different. These variations in physical dimensions in the transistor cells, cause the amount of the hot electrons injected into certain floating gates to differ. Thus, the conventional flash memory suffers from the problem that it is difficult to precisely set each threshold voltage to a predetermined value.

SUMMARY OF THE INVENTION

It is therefore an object of the present invention to provide a flash memory including improved transistor cells by which the voltages of the floating gate is accurately controlled.

One aspect of the present invention resides in a flash memory includes a plurality of MOSFETs (metal oxide semiconductor field effect transistors). Each of the MOSFETs comprises a first conductive type substrate, a source, and a drain. Both of the source and the drain are doped with an impurity of a second conductive type which is different from that which is used to dope the first conductive type substrate. The source and the drain are formed on one major surface of the substrate. A floating gate is situated over the major surface via a first insulation layer in a manner to control a current flowing through a channel between the source and the drain. The floating gate is highly resistive and such as to essentially hold electrons in a region into which they are injected from a depletion layer formed in the channel. A control gate is further provided over the floating gate via a second insulation layer.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 5 is a flow chart which includes steps which characterize a reprogramming operation of the transistor cell of FIG. 3;

DETAILED DESCRIPTION OF THE PREFERRED EMBODIMENTS

Figure 1:
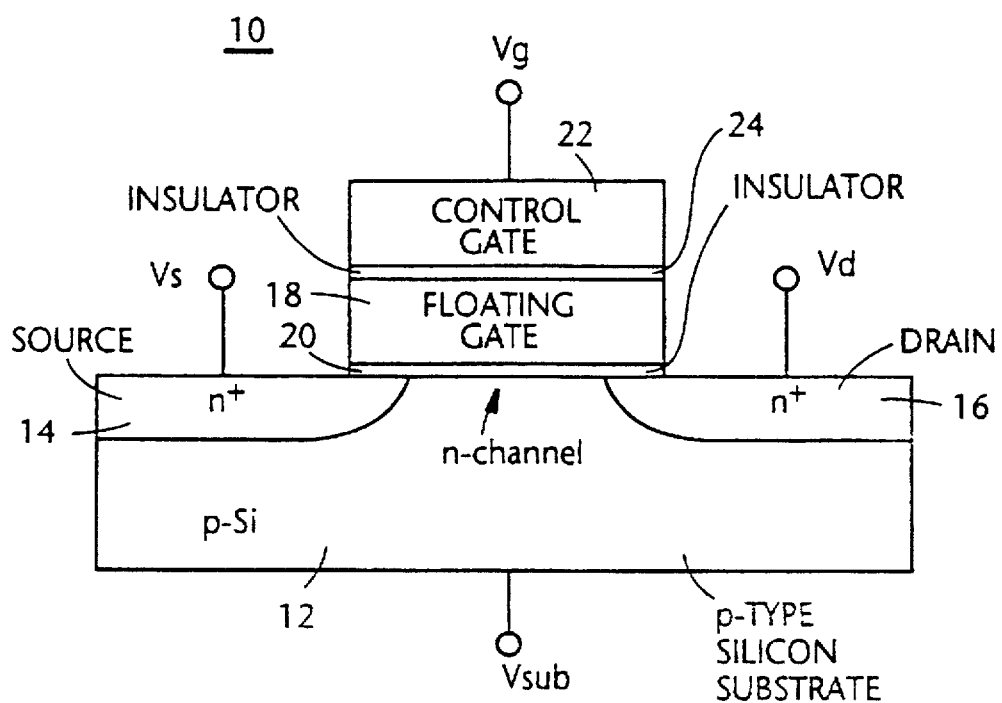
FIG. 1 is a schematic cross-sectional view of a transistor cell of a conventional flash memory, referred to in the opening paragraphs of the instant disclosure.
Figure 3:
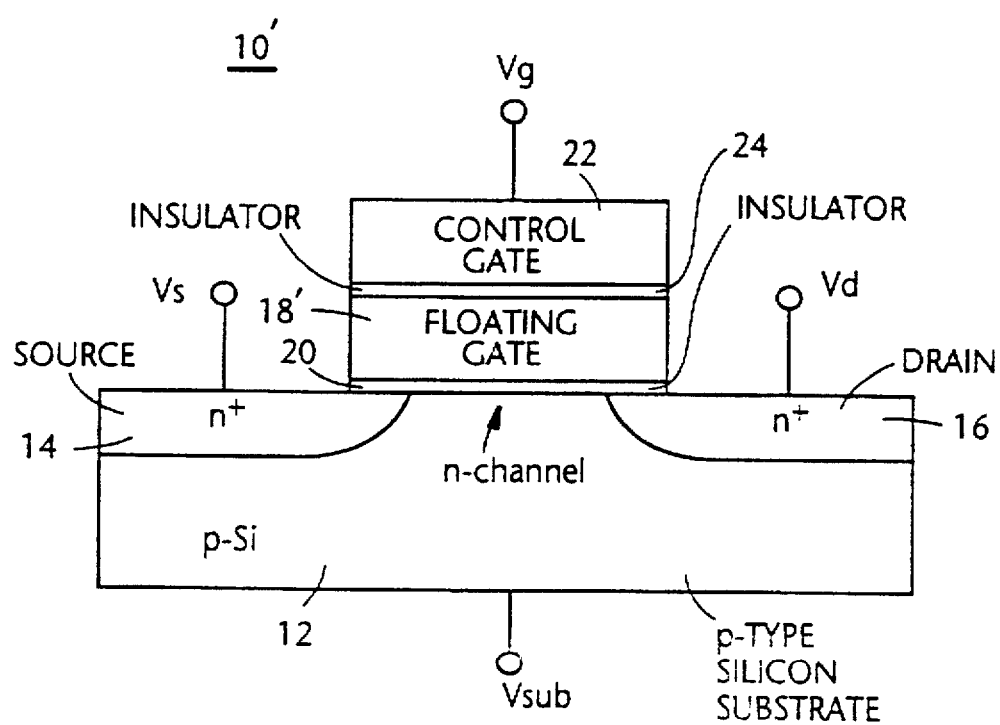
FIG. 3 is a schematic cross-sectional view of a transistor cell of the present invention which forms part of a flash memory.

FIG. 3 is a schematic cross-sectional view of a transistor cell according to the present invention and which forms part of a flash memory. The cell of FIG. 3 is configured in a manner which is essentially the same as that of FIG. 1 except that a poly-silicon floating gate 18' is rendered highly resistive compared with the counterpart 18 of FIG. 1.

More specifically, the floating gate 18' is formed so as to be highly resistive and to hold or capture the hot electrons in essentially the same region that they were injected. To achieve this situation, the floating gate 18' is doped with an impurity such as phosphorus in the order of $1\times10^6/cm^3$ to $1\times10^{18}/cm^3$ by way of example. In other words, the transistor cell of the present invention is characterized by the fact that the floating gate 18' is able to locally retain the electrons injected thereinto. This localization of the electrons in the floating gate 18' will be discussed in more detail with reference to FIGS. 6A–6C.

Figure 4:
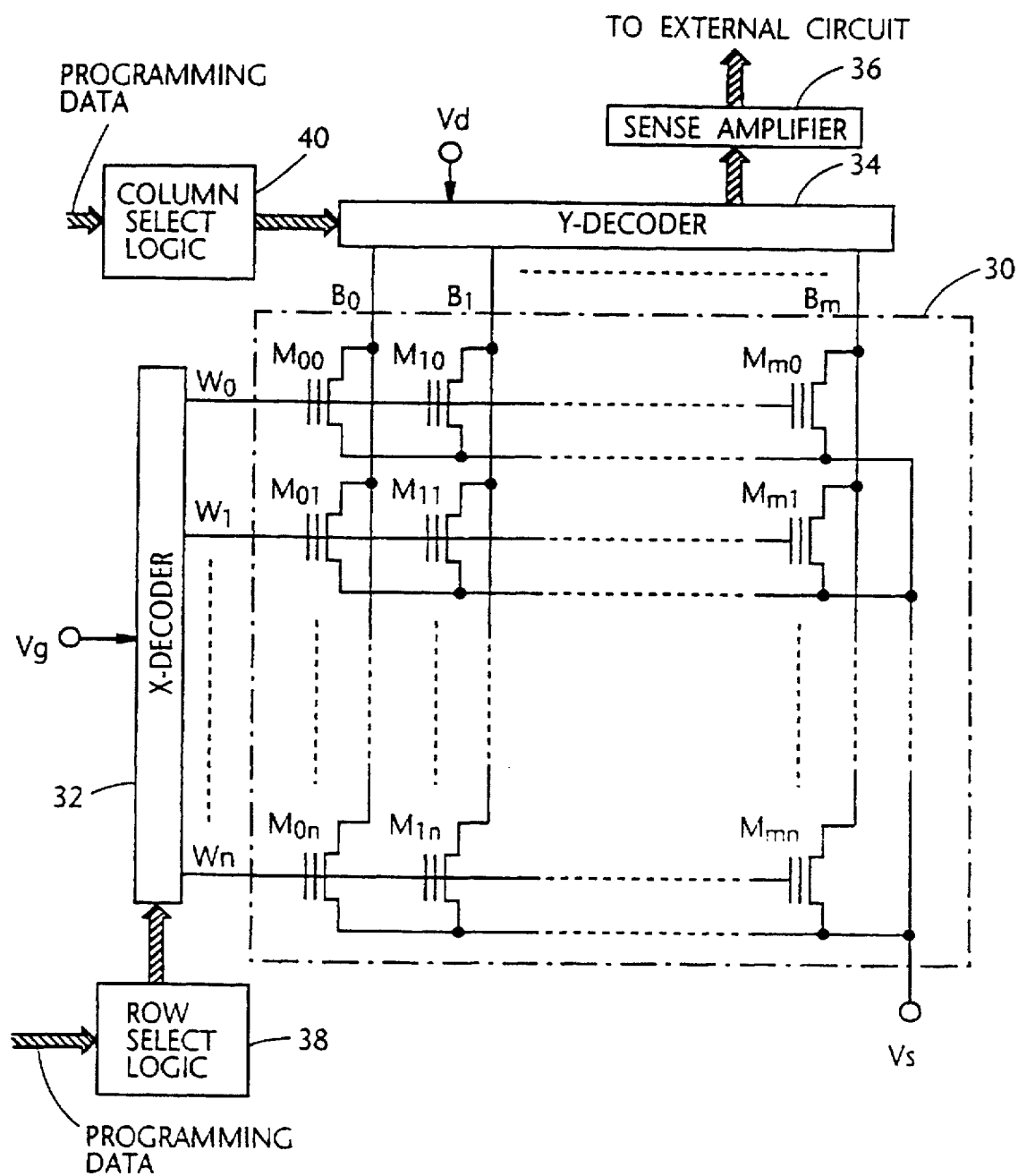
FIG. 4 is a diagram schematically depicting a manner wherein a flash memory includes a matrix array of transistor cells and a plurality of associated functional blocks, and which is given to provide a better understanding of the present invention.

FIG. 4 is presented merely for a better understanding of a flash memory which comprises a matrix array of transistor cells such as shown in FIG. 3. Since the arrangement of FIG. 4 is well known in the art, only a brief description thereof is given.

In FIG. 4, a memory array 30 is formed by transistor cells $M_{oo}$ to $M_{mm}$, an X-decoder 32, a Y-decoder 34 and a sense amplifier 36. The X-decoder 32 is supplied with the control gate voltage Vg and has word lines $W_o$ to $W_n$ respectively extending to the rows of the transistor cells 30, while the Y-decoder 34 is supplied with the drain voltage Vd and has bit lines $B_o$ to $B_m$ respectively extending to the columns of-the cells. Each bit line is connected to the drain electrodes of the cells of the corresponding column and each word line is connected to the gate electrodes of the cells of the corresponding row. The source electrodes of all transistor cells are connected to receive the source voltage vs.

It is to be noted that the substrate electrode Vsub is not shown in FIG. 4 thus simplifying the drawing.

Programming data for selecting one or more transistor cells is supplied to a row select logic 38 and a column select logic 40. The row select logic 38 is connected to the X-decoder 32 to select one or more word lines, while the column select logic 40 is connected to the Y-decoder 34 to select one or more bit lines.

Figures 2A, 2B:
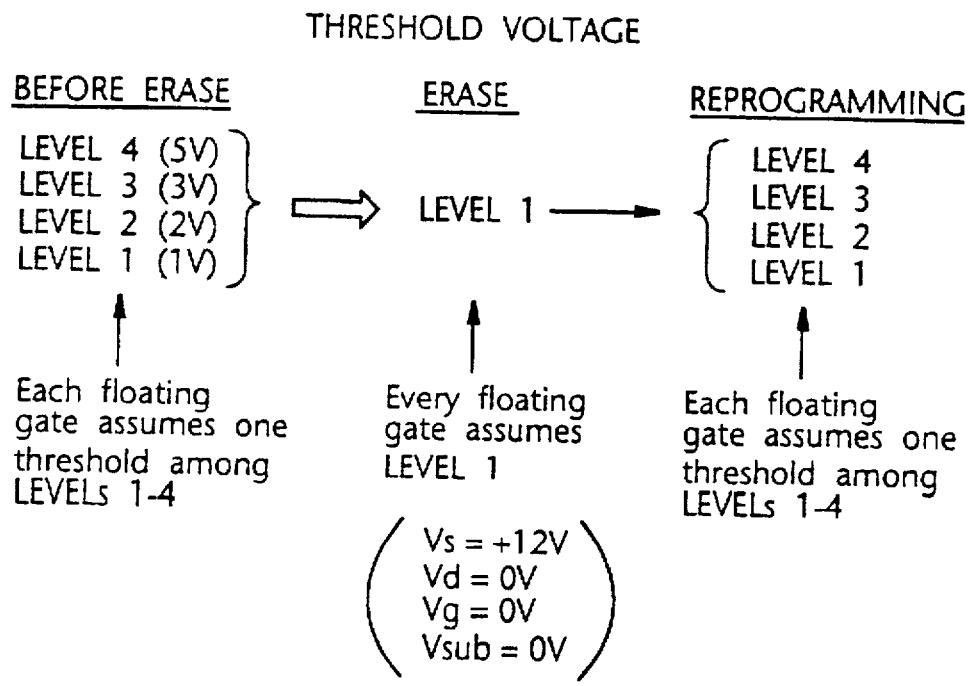
FIG. 2A is a diagram depicting the change of threshold voltage of a floating gate of FIG. 1.
FIG. 2B is a diagram depicting voltage setting of the transistor cell of FIG. 1 during reprogramming.

Returning to FIG. 3, the erase operation of the transistor cell of FIG. 3 is accomplished in exactly the same manner as described with reference to FIG. 2A. Thus, after a predetermined time period (about one second), the threshold voltage of the floating gate 18' is brought to Level 1 (1 v) irrespective of the previous threshold level. Thus, all the floating voltages of a flash memory cells are set to the first threshold voltage (Level 1 (1 V)).

FIG. 5 is a flow chart which includes steps which characterize the programming (or reprogramming) operation which is used with the improved transistor cell of FIG. 3.

It is assumed that the floating gate 18' of a given transistor cell has been erased and thus assumes the Level 1 (1 V). Further, Levels 1–4 respectively correspond to 1 V, 2 V, 3 V and 5 V as in the case of the prior art. Still further, during the programming operation, both Vs and Vsub are set to 0 V. The above mentioned voltages of Levels 1–4 are exemplary and in no way limited thereto.

According to the routine depicted in FIG. 5, at step 50, a check is made to determine if a new threshold voltage (Vth) should be changed to other than Level 1. If the answer is not affirmative at step 50, no voltage change is implemented and thus the threshold voltage is fixed to Level 1 at step 52. Otherwise, the routine goes to step 54 wherein the new threshold voltage is provisionally set to Level 2 with Vd=+4 V and Vg=+9 v. The programming time is typically in the order of 10 μs. Following this, at step 56, a check is further made to determine if the new threshold voltage should be other than Level 2. If the outcome of the enquiry performed in step 56 is "no", the routine goes to step 58 at which the threshold new voltage is fixed to Level 2. Otherwise, the routine proceeds to step 60 at which the new threshold voltage is provisionally set to Level 3 with Vd=+6 V and Vg=+12 V. The programming time is typically in the order of 10 μs. Following this, at step 62, a check is made to determine if the new threshold voltage should be equal to Level 4. If the answer at step 62 is "no", the new threshold voltage is settled to Level 3 at step 64. Otherwise (viz., the answer is "yes") at step 66, the new threshold voltage is changed to Level 4 with Vd=+8 V and Vg=+16 V and then fixed thereat at step 68. The programming time is typically in the order of 10 μs.

In FIG. 5, the threshold voltages are selected among the four Levels 1–4. However, the number of threshold voltages in FIG. 5 is exemplary and can be increased to more than four. Further, in FIG. 5, only one transistor cell is discussed for the programming for the sake of simplifying the disclosure. However, in practice, at step 54, all the transistor cells of the flash memory, each of which should be set to other than Level 1, are simultaneously set to Level 2. This applies to the operations at steps 60 and 64.

Figure 6A:
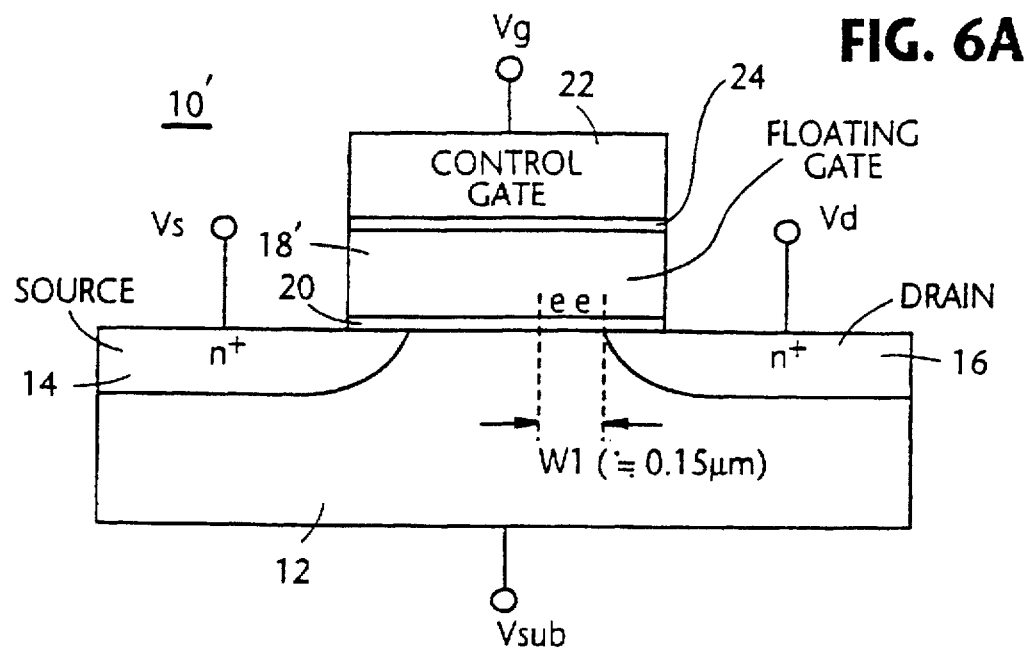
FIGS. 6A, 6B and 6C are each a cross-sectional view schematically showing the manner in which a depletion width varies during the programming or reprogramming.
Figure 6B:
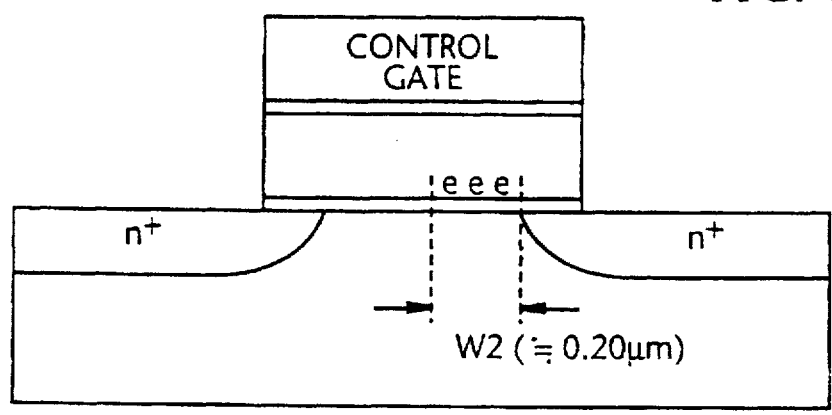
Figure 6C:
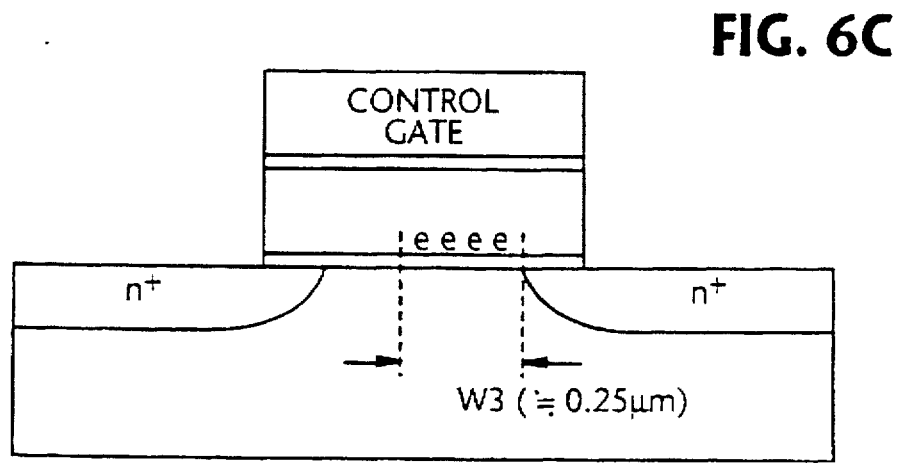

Steps 54, 60 and 66 are described in more detail with reference to FIGS. 6A, 6B and 6C, respectively.

At step 54, with Vd=+4 V and Vg=+9 V, the memory cell is rendered conductive and a channel is established between the source 14 and the drain 16. Under these Conditions some of the channel electrons acquire sufficient energy enough to exceed a Si—SiO$_2$ barrier between the substrate 12 and the silicon-dioxide 20. These hot electrons are injected into the floating gate 18'. In this case, since the drain voltage Vd is not so high, the depletion width (depicted by W1 in FIG. 6A) is relatively narrow. By way of example, if the substrate density of the substrate 12 is 2×10$^{17}$/cm$^3$, the depletion width extends from the edge of the drain by about 0.15 μm as illustrated in FIG. 6A wherein "e" denotes electrons injected into the floating gate 18'. The channel length is about 4.0 μm. As mentioned above, the floating gate 18' is rendered highly resistive and thus essentially hold and retain the electrons in the region or area into which they were injected.

At step 60, since the drain voltage Vd is raised to +6 V, the depletion width in this case (depicted by W2 in FIG. 6B) further extends, as compared with the case at step 54, from the edge of the drain by about 0.20 μm as illustrated.

At step 66, with the drain voltage Vd being raised to +8 V, the depletion width in this case (depicted by W3 in FIG. 6C) still further extends from the edge of the drain up to about 0.25 μm as illustrated.

The channel region, below the region of the floating gate area where the electrons are located (FIGS. 6A to 6C), exhibits high resistance compared with the other channel region. Designating the high and low resistance values as RH and RL, the series resistance of the channel is defined by (RH+RL) which determines the channel current. Thus, if the resistance RH is controlled, the channel current can be controllably varied.

As discussed above, the floating gate 18' has a high resistance. However, there is no problem in extracting the electrons stored in the gate 18' during the erase operation.

Figure 7:
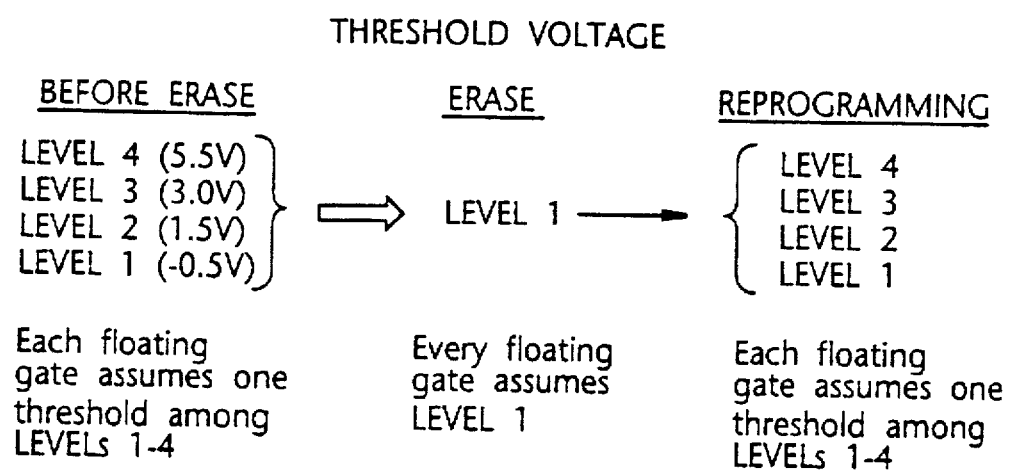
FIG. 7 is a diagram depicting the change of threshold voltage of the floating gate according to another type of reprogramming operation of the transistor cell of FIG. 3.

In the foregoing, all the threshold voltages are set to be positive. However, as an alternative, the lowest Level 1 (for example) can be set to a negative potential. This voltage setting is preferable in that the difference between adjacent threshold voltages can be broaden compared with the case where all the threshold voltages are positive. This means that the burden on designing the sense amplifier 36 (for example) may be lessened because the difference between the adjacent currents to be sensed, can be widened. FIG. 7 is a diagram showing one example of the above discussion wherein Levels 1–4 are respectively set to −0.5 V, 1.5 V, 3.0 V and 5.5 V. FIG. 7 is similar to FIG. 2A and thus it is redundant to further describe the diagram of FIG. 7. Further, the number of threshold voltages is not limited to four as in FIG. 7 and can be increased to N (wherein N is greater than 4). In this case, it is possible to set the upper half of the threshold voltages (if N is an even number) to positive values and the lower half to negative voltages by way of example.

In the above, as is known in the art, the negative threshold voltage can be developed by excessively extracting electrons from the floating gate 18' so as to leave holes therein. Further, the present invention can be applied to a p-channel memory cell.

It should be understood that the foregoing description is only illustrative of the present invention and that various alternatives and modification can be devised by those skilled in the art without departing from its scope. Accordingly, the present invention, which embraces all such alternatives, modifications and variances is limited only by the scope of the appended claims.

What is claimed is:

1. An improved flash memory of the type including a plurality of MOSFETs (metal oxide semiconductor field effect transistors) each of which comprises:

a first conductive type substrate;

a source and a drain, said source and drain both being doped with an impurity of a different type from that with which said first conductive type substrate is doped, said source and said drain being formed on one major surface of said substrate;

a floating gate, situated over said major surface via a first insulation layer, controlling a current flowing through a channel between said source and said drain; and a control gate provided over said floating gate via a second insulation layer, wherein the improvement comprises doping said floating gate with an impurity in order to increase the resistance of said floating gate so as to hold electrons in essentially the same region as they were injected from a depletion region formed in said channel during a programming or reprogramming operation.

2. A flash memory as claimed in claim 1, wherein said floating gate is made of polycrystalline silicon doped with an impurity in an order of from 1×10$^{16}$/cm$^3$ to 1×10$^{18}$/cm$^3$.

3. A flash memory as claimed in claim 1, wherein said depletion region has a width which is controlled by a drain voltage during said programming or reprogramming operation for changing an amount of said electrons stored in said floating gate.

4. A flash memory as claimed in claim 1, wherein said depletion region extends from said drain towards said source, said depletion region having a width which is controlled by a drain voltage during said programming or reprogramming operation for changing an amount of electrons stored in said floating gate.

5. A flash memory as claimed in claim 1, wherein said floating gate assumes, during said programming or reprogramming, one of a first to Nth different threshold voltages (wherein N is a positive integer equal to or more than four), each of said first to Nth different threshold voltages being determined by an amount of the electrons to be stored in said floating gate.

6. A flash memory as claimed in claim 5, wherein each of said first to Nth different threshold voltages is a positive voltage.

7. A flash mercury as claimed in claim 5, wherein at least the lowest voltage among said first to Nth different threshold voltages is a negative voltage.

8. A flash memory as claimed in claim 5, wherein said first to Nth threshold voltages are ordered from the lowest to the highest voltage, and one or more than one threshold voltage from said first to (N/2)th threshold voltages is negative.

9. A method of programming or reprogramming a flash memory which comprises a plurality of memory cells of MOSFETs, each of said memory cells including: a substrate; a source and a drain formed in said substrate; a floating gate situated over one major surface via an insulation layer and controlling a current flowing through a channel between said source and said drain, said floating gate doped with an impurity in order to increase the resistance of said floating gate so that electrons are essentially held in a region into which said electrons were injected; and a control gate provided over said floating gate via another insulation layer, said memory cells being selectively set to one of first to Nth different threshold voltages by controlling an amount of electrons injected into said floating gate, said first to Nth threshold voltages being ordered from the lowest to the highest voltage, said method comprising the steps:

(a) setting the first threshold voltage to all the memory cells of said flash memory;

(b) setting the second threshold voltage to all the memory cells to which one of the second to Nth threshold voltages is to be set; and (c) selectively setting the third to Nth threshold voltages in a sequential order to the remaining memory cells so as to set one of the third to Nth threshold voltages to all the memory cells except for the memory cells which have been set to one of the preceding threshold voltages.

10. A method as claimed in claim 9, wherein all said first to Nth threshold voltages are positive.

11. A method as claimed in claim 9, wherein one or more than one threshold voltages from said first to (N/2)th threshold Voltages is negative.

* * * * *